United States Patent
Ebefors et al.

(10) Patent No.: US 8,729,685 B2
(45) Date of Patent: May 20, 2014

(54) BONDING PROCESS AND BONDED STRUCTURES

(75) Inventors: Thorbjörn Ebefors, Huddinge (SE); Edward Kälvesten, Hagersten (SE); Niklas Svedin, Stockholm (SE); Anders Eriksson, Solna (SE)

(73) Assignee: Silex Microsystems AB, Jarfalla (SE)

( * ) Notice: Subject to any disclaimer, the term of this patent is extended or adjusted under 35 U.S.C. 154(b) by 65 days.

(21) Appl. No.: 13/318,205

(22) PCT Filed: Apr. 30, 2010

(86) PCT No.: PCT/SE2010/050479
§ 371 (c)(1),
(2), (4) Date: Dec. 7, 2011

(87) PCT Pub. No.: WO2010/126448
PCT Pub. Date: Nov. 4, 2010

(65) Prior Publication Data
US 2012/0076715 A1   Mar. 29, 2012

(30) Foreign Application Priority Data

Apr. 30, 2009 (SE) ....................... 0900590

(51) Int. Cl.
*H01L 23/06* (2006.01)
(52) U.S. Cl.
USPC ....................................... 257/684
(58) Field of Classification Search
USPC .................. 257/684, 687–733, 787–796, 257/E23.001–E23.194, E21.499–E21.519, 257/685, 686, E25.031–E25.032, E23.04, 257/E21.502–E21.504; 438/15, 25, 26, 51, 438/55, 112, 124, 126
See application file for complete search history.

(56) References Cited

U.S. PATENT DOCUMENTS

| | | |
|---|---|---|
| 5,604,160 A | 2/1997 | Warfield |
| 7,172,911 B2 | 2/2007 | Kalvesten et al. |

(Continued)

FOREIGN PATENT DOCUMENTS

| | | |
|---|---|---|
| WO | 03/068669 | 8/2003 |
| WO | 2004/025727 | 3/2004 |

(Continued)

OTHER PUBLICATIONS

International Search Report dated Nov. 1, 2010, corresponding to PCT/SE2010/050479.

*Primary Examiner* — Dao H Nguyen
*Assistant Examiner* — Tram H Nguyen
(74) *Attorney, Agent, or Firm* — Young & Thompson

(57) ABSTRACT

A sealing and bonding material structure for joining semiconductor wafers having monolithically integrated components. The sealing and bonding material are provided in strips forming closed loops. There are provided at least two concentric sealing strips on one wafer. The strips are laid out so as to surround the component(s) on the wafers to be sealed off when wafers are bonded together. The material in the strips is a material bonding the semiconductor wafers together and sealing off the monolithically integrated components when subjected to force and optionally heating. A monolithically integrated electrical and/or mechanical and/or fluidic and/or optical device including a first substrate and a second substrate, bonded together with the sealing and bonding structure, and a method of providing a sealing and bonding material structure on at least one of two wafers and applying a force and optionally heat to the wafers to join them are described.

13 Claims, 13 Drawing Sheets

(56) References Cited

U.S. PATENT DOCUMENTS

| | | | |
|---|---|---|---|
| 7,276,789 B1 | 10/2007 | Cohn et al. | |
| 7,442,570 B2 | 10/2008 | Nasiri et al. | |
| 7,846,815 B2* | 12/2010 | Karlin et al. | 438/456 |
| 8,191,756 B2* | 6/2012 | Coppeta et al. | 228/115 |
| 2002/0179921 A1* | 12/2002 | Cohn | 257/99 |
| 2003/0183307 A1 | 10/2003 | Liebeskind et al. | |
| 2004/0219764 A1 | 11/2004 | Syllaios et al. | |
| 2007/0048898 A1 | 3/2007 | Carlson et al. | |
| 2007/0122929 A1 | 5/2007 | Diem et al. | |
| 2007/0290282 A1 | 12/2007 | Belov et al. | |
| 2008/0067652 A1* | 3/2008 | Menard et al. | 257/678 |
| 2009/0243065 A1* | 10/2009 | Sugino et al. | 257/686 |
| 2010/0244159 A1* | 9/2010 | Karlin et al. | 257/415 |
| 2012/0319220 A1* | 12/2012 | Noda et al. | 257/416 |

FOREIGN PATENT DOCUMENTS

| | | |
|---|---|---|
| WO | 2004/084300 | 9/2004 |
| WO | 2006/052763 | 5/2006 |
| WO | 2008/091221 | 7/2008 |

\* cited by examiner

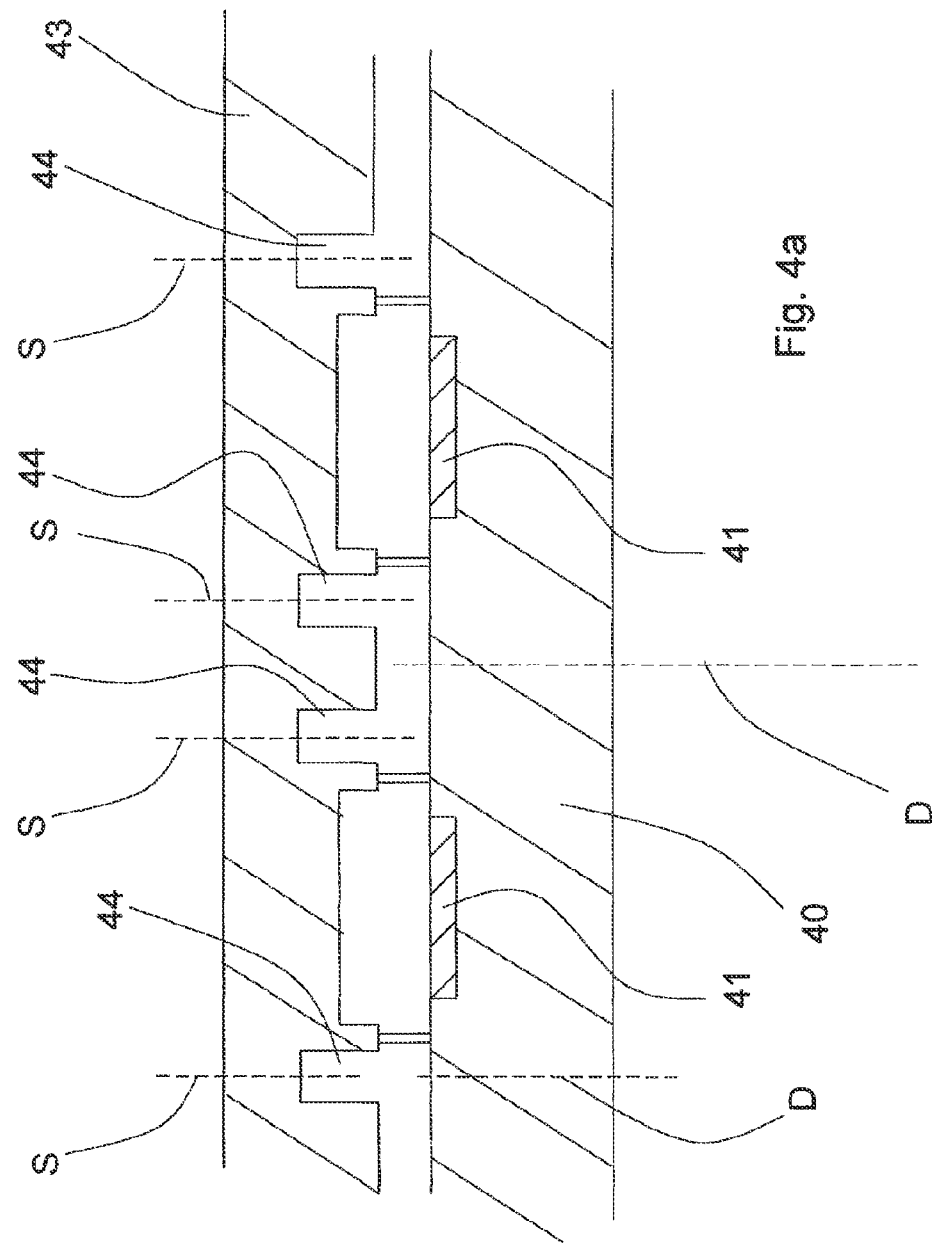

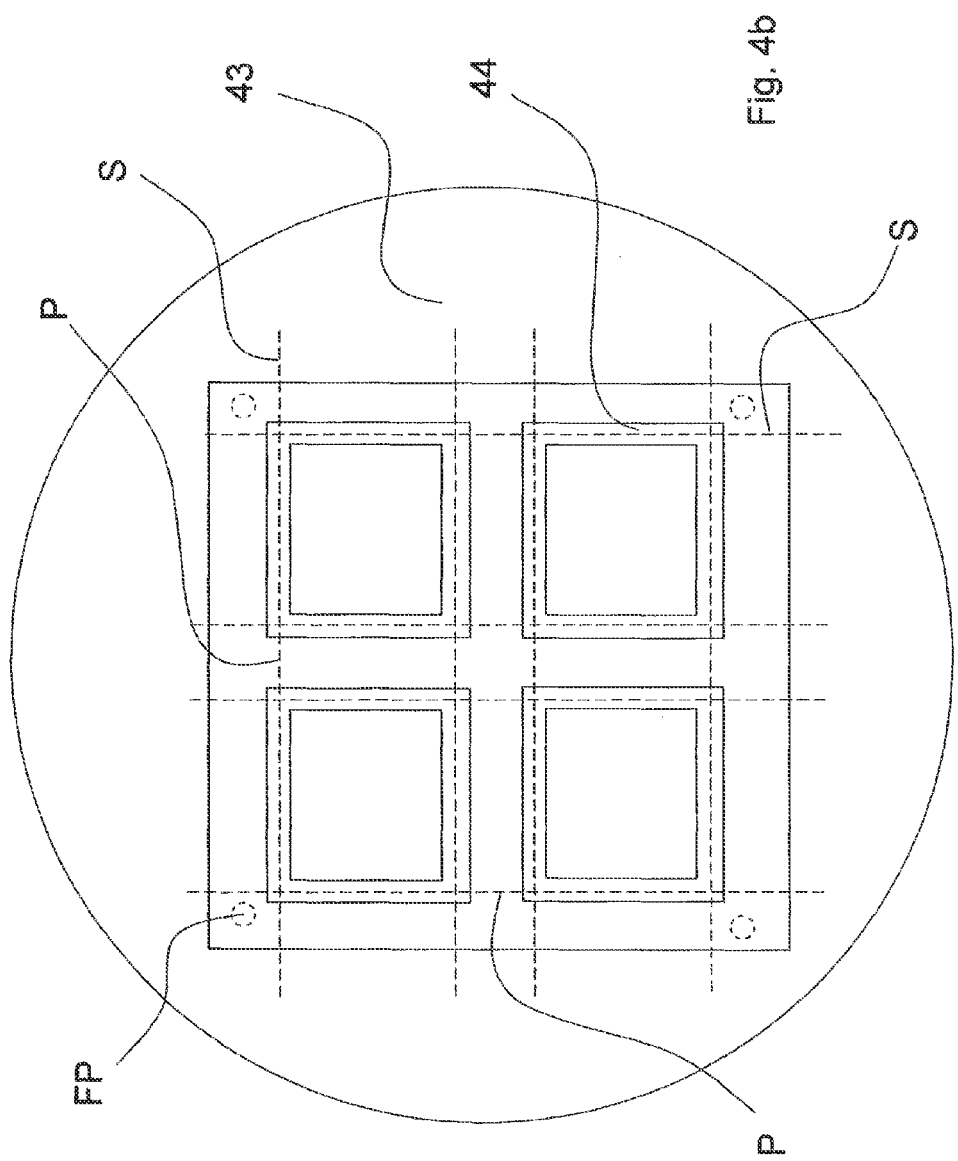

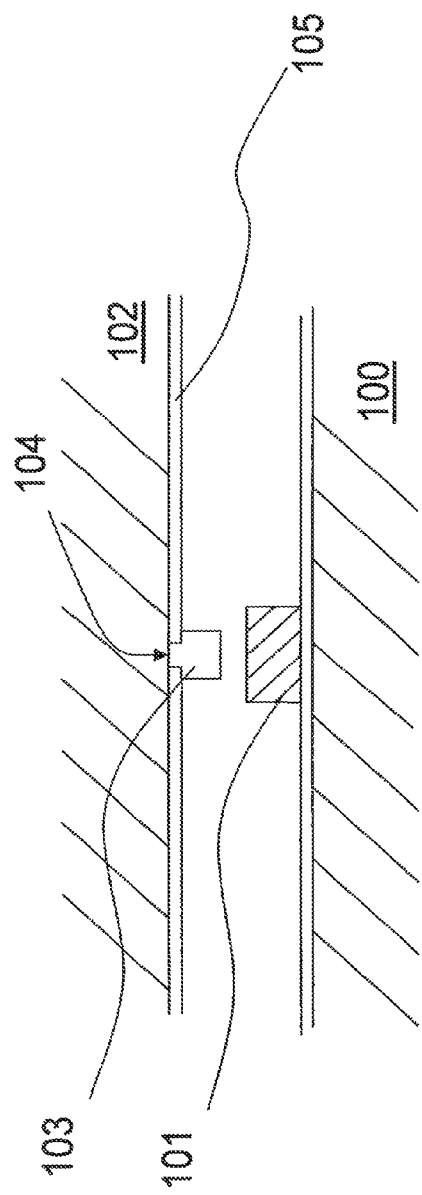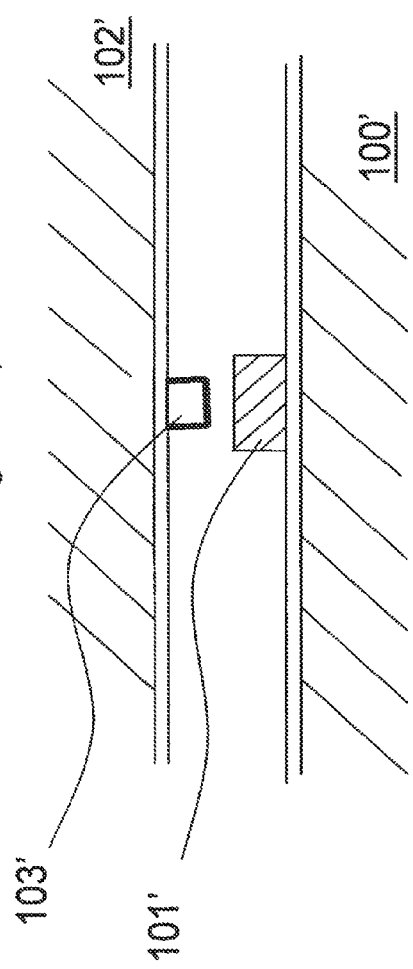

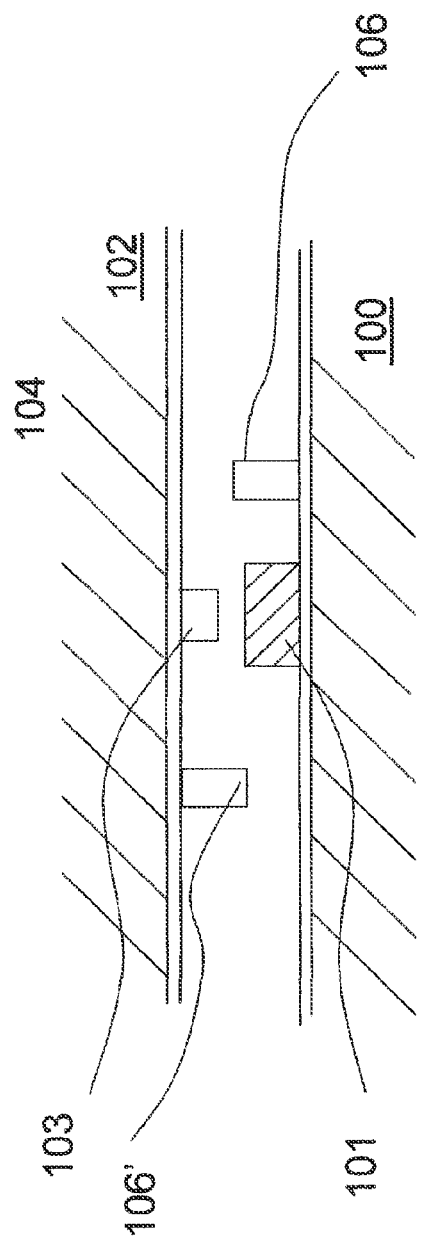
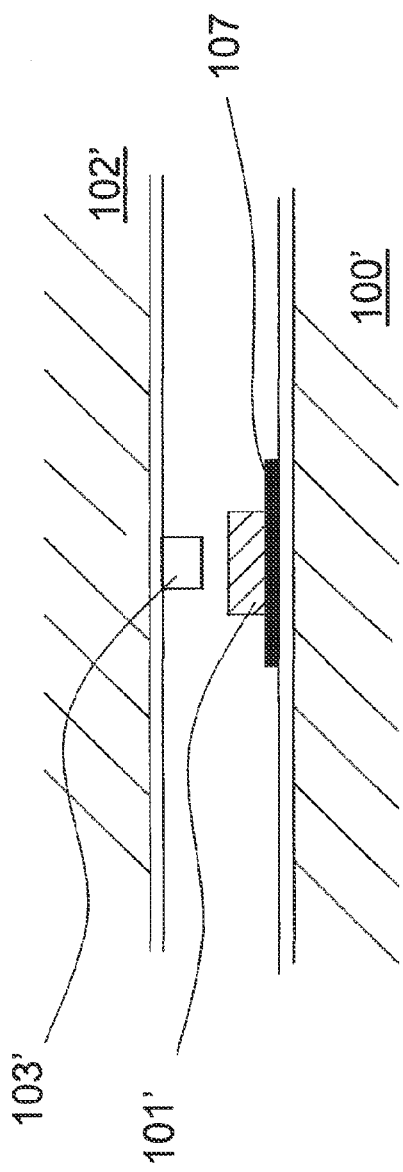

BONDING PROCESS AND BONDED STRUCTURES

The present invention relates to packaging of MEMS and micro-electronic devices. In particular it relates to methods of providing functional capping which can involve vacuum sealing or bonding passive components to CMOS.

BACKGROUND OF THE INVENTION

In the MEMS and micro-electronic fields there is frequently a need for bonding wafers together for the purpose of encapsulating structures in vacuum cavities or in cavities with controlled atmosphere. Such structures may have to be operable during very long times, most often tens of years. It can also be desirable to provide electrical connection between wafers via the sealing.

It is of course absolutely necessary that the joints that holds/bonds the wafers together and that provides the actual sealing of said cavities will provide good enough sealing that will not deteriorate over time.

There is also a strive towards more cost effective wafer-level packaging, rather than the prior art individual chip packaging.

There are several prior art methods that have been successfully used over the last ten years or so for packaging, i.a. glass frit bonding (see e.g. U.S. Pat. No. 5,604,160, Motorola), direct Si—Si fusion bonding, anodic glass bonding, eutectic bonding, soldering, just to mention some.

Whenever possible (i.e. flat substrates, and substrates without metal and unlimited thermal budget), fusion bonding is the most attractive bonding method for creating sealed structures, since it allows both silicon via integration, and monolithically integrated components, e.g. a polysilicon structure, an example of which is disclosed in WO 2008/091221 (Silex Microsystems).

In fusion bonding one can use various combinations of material (high purity, long term stable) in the substrates to be bonded together, e.g. Si—Si, Si—SiO or SiO—SiO, with full Si—Si bond.

The advantages of fusion bonding are the following:

The bond exhibits high bond strength and the sealing obtained is tight. A bond width area for tight seals of <100 μm is attainable. There are no foreign materials involved that could cause problems with mechanical strength e.g. due to different thermal expansion between sealing material and substrate.

Fusion bonding is preferably done at the beginning of a process flow, before the wafers have been structured with topography.

It enables pre-processing with unrestricted thermal budget (contact doping and anneal for SOI based Sil-Vias possible) and also wet processing is possible.

It is attractive for electrostatic/capacitive systems with silicon via integration in the CAP. This is particularly useful in for example gyro and accelerometer applications, that can be manufactured in accordance with methods defined and described in applicants own WO 2004/084300 and WO 2008/091221.

Among disadvantages the following can be mentioned:

The resistance in Si—Si bonding could become too high if low ohmic interconnections are required, and Si—SiO- and SiO—SiO-bonds do not give electrical interconnection (SiO=insulator).

Certain versions of fusion bonding (>1000° C. anneal) are not CMOS compatible, but others have demonstrated that low temp fusion bond is possible by plasma assisted methods, but here is still ongoing discussions how tight the seal one gets really is. There is still a risk for leakage.

However, the largest disadvantage by far of fusion bonding is its sensitivity to topography. Fusion bonding requires ultra flat surfaces making integrating vias of silicon or metal vias made prior to bonding ("via-first" approach") difficult if not impossible.

Also, bonding wafers together to form a "sealing" bond if one of the wafers is metallised (i.e. exhibiting topography) CMOS wafer requiring electrical connection between the wafer is not possible.

Other methods have been attempted but have not been so successful, such as thermo compression bonding (TC bonding) and eutectic bonding. The last two methods have been investigated in two doctoral theses, namely "LOW TEMPERATURE WAFER LEVEL VACUUM PACKAGING USING AU-SI EUTECTIC BONDING AND LOCALIZED HEATING" by Jay S. Mitchell (The University of Michigan, 2008), and "FABRICATION AND CHARACTERIZATION OF WAFER LEVEL GOLD THERMO COMPRESSION BONDING" by C. H. Tsau, (Massachusetts Institute of Technology 2003), both of which are incorporated herein in their entirety by reference.

WO 03/068669 (Silex Microsystems) describes MEMS devices based on eutectic and solder wafer level bonding methods.

In U.S. Pat. No. 7,183,622 (Intel) there is disclosed an apparatus including a first substrate, one or more microelectromechanical systems (MEMS) coupled to the first substrate, a second substrate coupled with the first substrate, and one or more passive components coupled to the second substrate. A method may include aligning a first substrate having one or more MEMS coupled thereto and a second substrate having one or more passive components coupled thereto, and coupling the aligned substrates.

In U.S. Pat. No. 7,442,570 (InvenSense) there is disclosed a method of bonding of germanium to aluminum between two substrates to create a robust electrical and mechanical contact is disclosed. The bond has the attributes: (1) it can form a hermetic seal; (2) it can be used to create an electrically conductive path between two substrates; (3) it can be patterned so that this conduction path is localized.

All of these methods have their advantages and disadvantages.

One problem is that deviations from flatness on substrates to be joined by bonding, i.e. substrates exhibiting a topography across their surface, may cause weak points in the bond that eventually can give rise to leakage into or out from the sealed off cavity. Even worse, the sealing may be deficient from the start, i.e. there was not a complete sealing of the cavity already during manufacture, which means that the yield will be lowered.

Another problem is that gold, which is the most commonly used sealing medium can have a tendency to "drift away" by diffusion, i.e. the sealing joint may become depleted of material, which can give rise to the above mentioned leakage problem.

SUMMARY OF THE INVENTION

In view of the prior art there is room for improvements in the methods of bonding for providing sealing in MEMS and micro-electronic devices.

Thus, according to the present invention there is provided novel methods of joining wafers by bonding. In particular the novel processes are used for hermetically sealing structures between wafers such that controlled atmosphere is obtained in closed cavities formed between said wafers during manufacture. In particular also the novel processes provide for proper sealing also when the substrate wafers to be joined exhibit topography, i.e. the wafers are not planar over the entire surface. Such non-planarity can be caused by routing structures required to connect the structures inside the cavity with e.g. wire bonding pads on the outside.

In a first aspect of the present invention there is provided a sealing structure, such that if a leak occurs in some point there will be "leak-proof" structures provided by laying out the sealing structure in an inventive pattern. In particular this is achieved by providing concentric strips of sealing material, surrounding the cavities to be sealed, and having "cross-bars" connecting the concentric strips at certain intervals. The sealing structure is defined in claim 1.

The term "concentric" shall be taken to encompass any shape, i.e. not only circular, of the sealing strips. The term shall mean only that there is an outer strip that surrounds an inner strip completely.

In a further aspect of the invention there is provided a method of bonding providing variable compressibility of the bonding medium, whereby the problems inherent in the topography of the substrate wafers are substantially reduced if not eliminated. The method is defined in claim 18.

In another aspect of the invention there is provided a monolithically integrated electrical and/or mechanical and/or fluidic and/or optical device comprising a first substrate and a second substrate, bonded together with a sealing and bonding structure, and is defined in claim 28.

Further embodiments are defined in the dependent claims.

BRIEF DESCRIPTION OF THE DRAWINGS

FIG. 4 shows schematically a novel dicing method;
FIG. 12 shows embodiments of a further aspect of the invention;
FIG. 13 shows embodiments of still other aspects of the invention.

DETAILED DESCRIPTION OF THE INVENTION

Figure 1:
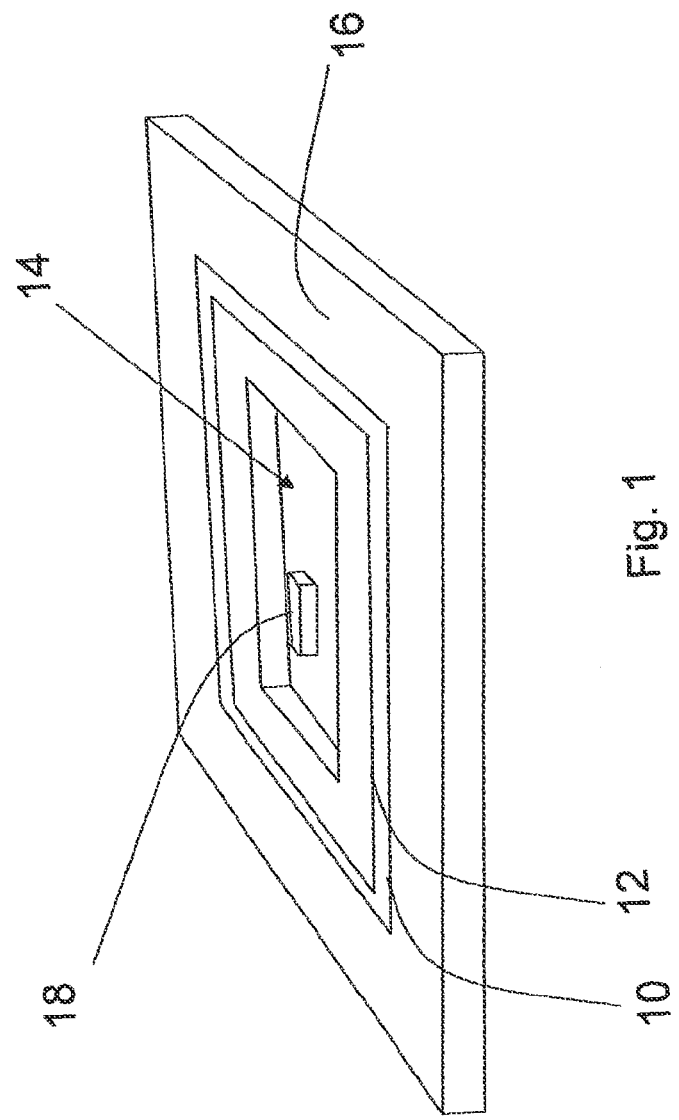
FIG. 1 illustrates schematically in perspective view a sealing material structure according to the invention.

For the purpose of this application the following terms and expressions are defined:

"Monolithically integrated component" shall mean that a functional (meaning that it performs or is capable of performing a function) component is made on and/or in a semiconductor wafer, such as by doping a plurality of areas and then interconnecting them by various means, well known in the semiconductor field. The expression shall also be taken to encompass components made by depositing material layers and patterning in order to build e.g. MEMS structures on the wafer. CMOS structures and components as well as bi-CMOS and bipolar technology, and the like, in a wide sense, are also included within this expression. Discrete components that are separately made and attached to a wafer surface, are thus not included in this expression.

A "wafer" is normally a semiconductor disk, commonly of silicon, having a diameter of 3-12 inches and 250-1000 μm thick. It can also be a SOI wafer.

The term "substrate" is most often the same as a wafer as defined above, and these terms are use interchangeably. However, a substrate could also be one chip carrying a single component, i.e. the resulting product from a wafer level process, after cutting into discrete chips.

By "compressibility" is meant how easily a structure is compressed when subject to a force in the normal direction. It can be a function of the material itself, but in the present invention it most often refers to how the geometry of structures imparts variable compressibility relative to other structures having a different geometry.

First a brief outline of some bonding methods will be given for better understanding of the invention. However, it should be noted that fusion bonding is not used in the present invention.

Thermo Compression bonding (TC) entails the provision of a suitable metal, most commonly gold (Au), but also Cu—Cu, Al—Al and other metal combinations, as the bonding material. Thereby the metal is applied as "bumps" or strips of material on each piece to be bonded together, either entire wafers or discrete chips cut from wafers, on locations matching each other. The separate components are heated (but not melted) and then brought together under application of external force whereby the metal on each component together forms a unitary bond between the components.

This kind of bonding is stable and it is easy to form the bond because gold is a soft metal. Unfortunately gold is an expensive metal, and this method is relatively sensitive to any topography on or of the components to be bonded together. The latter could lead to leakage if the bond did not form properly at points where it has to form across elevated structures on the components.

TC bonding has the following advantages:

It is a low temperature solid state phase bonding process (300° C. at least in theory) without formation of liquid (eutectic) in the bond interface that could flow out creating short circuits. Also, the electrical interconnections are low ohmic through bond interface (also with routing). There is no material interface creating problems for RF signals. It is easy to integrate the TC bond with metal-vias (such methods are disclosed in applicants own Swedish (unpublished) patent application 0850083-7. Getter material can be integrated for high vacuum applications.

A disadvantage with TC bonding is that comparatively high forces are required in the process which can easily cause wafers to break.

Eutectic bonding entails provision of an alloy of e.g. gold and another component such as tin (AuSn) on one component and e.g. gold on the other (it should be noted that other metals such as silver, lead and copper are usable, although operation temperatures will be different). A combination of gold and silicon, poly-silicon, silicon and germanium also form eutectic compositions at suitable temperatures (see above mentioned SE-0850083-7). Bringing the components together under heating will cause the metals to melt and form a eutectic material. The advantage of this kind of bonding is that the temperature being used is significantly lower than the CMOS processing temperatures, which means that the bonding can be carried out after manufacture of CMOS structures without damaging said structures. Also, the fact that the bonding material melts implies that variations in topography between wafers could be "swallowed" by the molten material. However, the temperature should not exceed 400° C. in order to render this method CMOS-compatible.

However, gold can contain oxygen or nitrogen which could "degas" from the bond and e.g. end up inside a cavity. This will eventually lead to a pressure increase which can render the device inoperable. It may be necessary to provide so called getter materials inside the cavity to get rid of the degassed oxygen/nitrogen (as described in WO 2008/091221).

The present invention relates to the use of modifications of the above known processes to make sealed structures having novel features. In particular the problem of topography mentioned above can be substantially reduced if not eliminated.

Figure 7:
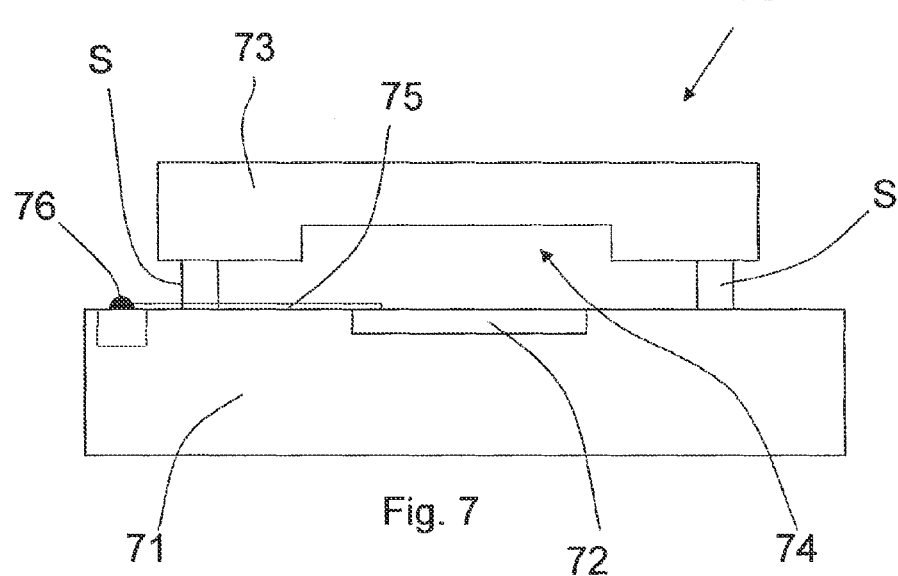
FIG. 7 shows schematically a CMOS structure encapsulated by providing a "capping structure" and a sealing according to the invention.

In one aspect there is provided encapsulated monolithically integrated components/devices (e.g. CMOS components) where wire bonding is facilitated (see FIG. 7).

Figure 8:
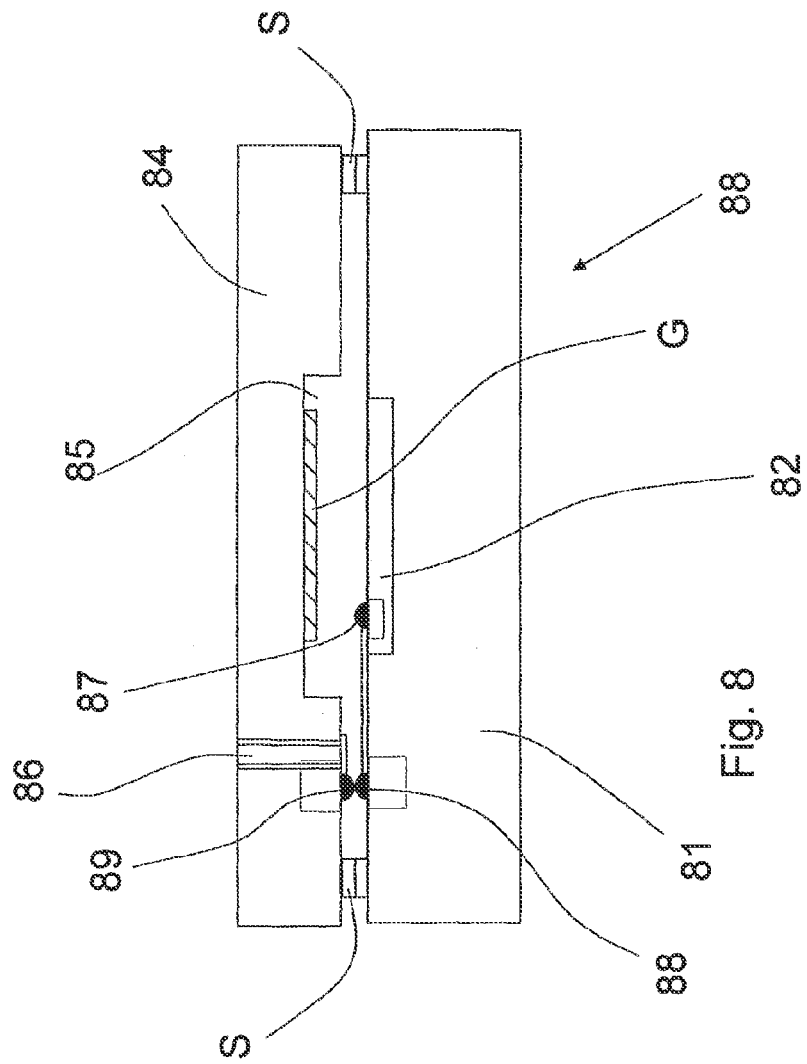
FIG. 8 shows lateral routing.

In a further aspect there is provided encapsulated monolithically integrated components/devices (e.g. CMOS/MEMS components/devices) combining routing and via structures i.a. enabling simplified mounting of components (see FIG. 8).

In a particular aspect there is provided a novel sealing and bonding structure for bonding two substrates which enables the manufacture of the above mentioned components/devices.

Reference is made to applicants own U.S. Pat. No. 7,172,911 and International Patent Application WO 2008/091221 in which a variety of structures are disclosed which suitably can be made using the novel bonding methods according to the present invention.

With reference to FIG. 1 the novel sealing material structure according to the invention will now be described.

In prior art sealing structures it has been common to use sealing "rings" enclosing an area to be sealed off hermetically. One such method entails the use of the provision of a "glass frit". Both substrates to be joined will have sealing material provide in congruent patterns. However, such sealing rings can be very sensitive to topography on the substrates to be joined, i.e. if sealing material is deposited over non-flat surfaces the irregularities will be carried over to the sealing material. In the bonding process there may be points of no contact, and one single break in the continuity, which can be extremely small, will cause leakage. Thereby any controlled atmosphere inside the sealed structure (such as vacuum or at least low pressure) will be disturbed by air leaking into the sealed cavity. The process is "dirty", i.e. could cause unwanted contamination, and the glass frit bond can outgas, hence ultra low vacuum levels cannot be attained.

FIG. 1 shows an example of a sealing structure according to the invention. It comprises two essentially concentric "rings" 10, 12 (the rings need of course not be circular; "ring" shall be taken to mean any closed loop structure encircling an area to be sealed off) encircling a cavity 14 on a substrate (wafer) 16, in which cavity there is located a structure 18 that need a controlled atmosphere for its function. In practice the "rings" need not be strictly "concentric". It will suffice that they be provided with a finite distance between them that should be greater than 1 μm (preferably however in the range of tens of μm), and this distance need not be constant along the perimeter.

This is the simplest embodiment of the sealing structure according to the invention. By providing concentric rings there will be provided for what is referred to as a "redundancy" in the sealing. By this we mean that if a break occurs in one of the rings there will still be no leakage because the other undamaged ring will prevent leakage. Of course there can be provided more than two rings which reduces the risk of leakage further, however at the price of increased material usage with accompanying higher cost.

Nevertheless, even if a plurality of concentric rings are provided there is of course still a risk of leakage to occur that may be too high.

Figure 2:
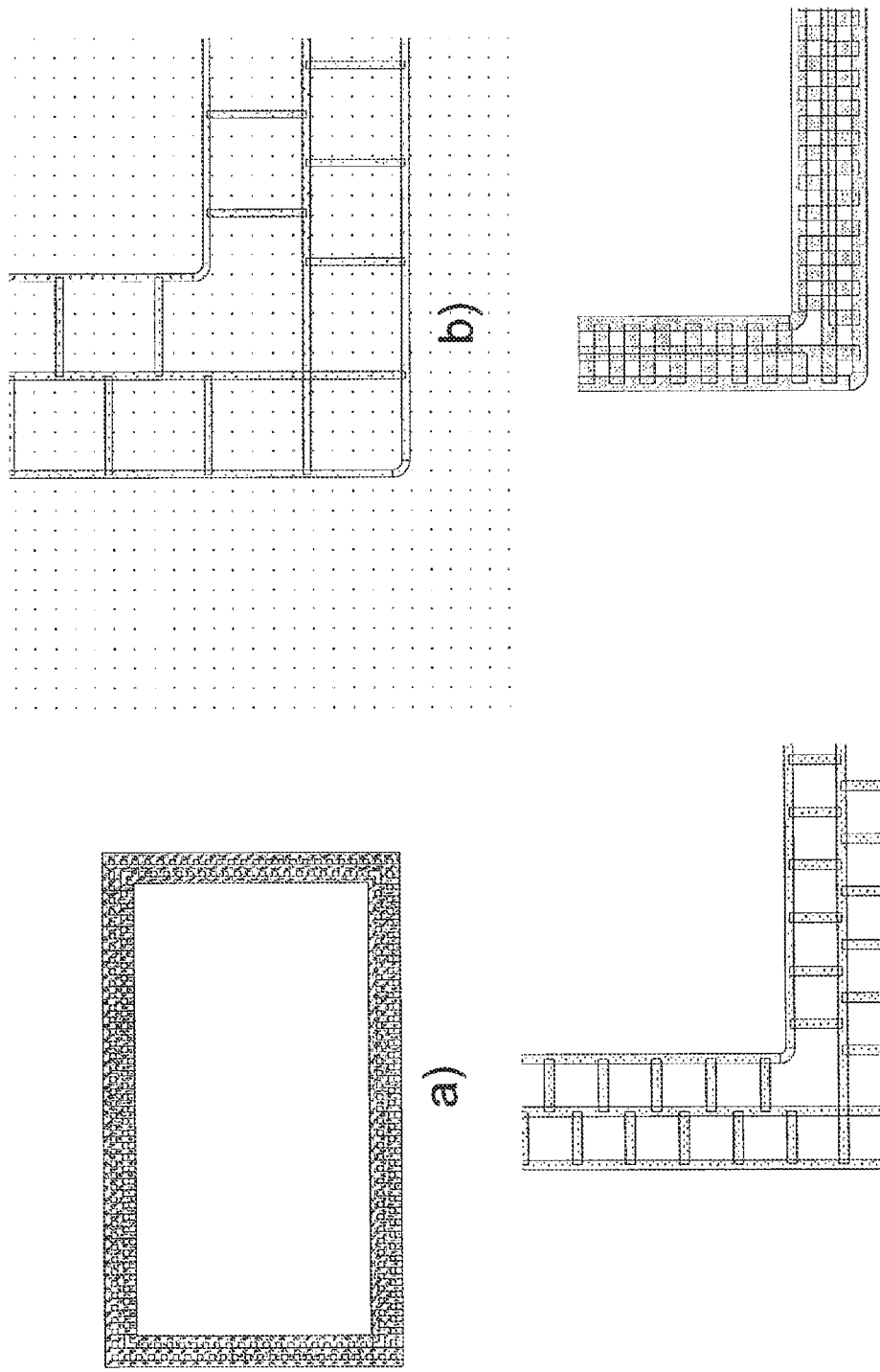
FIG. 2 shows different lay-outs for sealing structures according to the invention.

In order to further increase the redundancy, in a preferred embodiment there is provided cross-bars between the concentric rings at selected intervals to create a grid-like sealing material structure, as shown in FIG. 2. In this way the redundancy is increased manifold and the fabrication yield will increase.

There is a further advantage of providing the sealing structure in the form of a grid-like structure. Namely, in bonding processes where the sealing material is melted (e.g. eutectic bonding, soldering) prior art sealing structures comprising single solid rings contain relatively large amounts of material that will flow and either collect in corners which creates "bumps" or broaden the sealing unduly.

In order to adapt to misalignment of wafers in the operation of actually bringing them together for bonding, suitably the width of the sealing strips on one wafer is slightly wider than on the other wafer. In this way the adequate bonding surface will always be obtained regardless of minor misalignments. As an example, one sealing strip should be 5-10 μm wider than the other. In the extreme case the entire surface of one wafer could be metallised, in which case of course misalignment is no longer an issue. On the other hand, if gold is used for metallization the cost might be prohibitively high.

Also, in thermo compression bonding processes in which the material forming the bond is compressed, the deformation caused during compression will cause the material to "flow" (although not melted) because of the relative softness, and may thus create short-circuits.

In the grid structure according to the preferred embodiment the spaces between the cross-bars can accommodate e.g. molten material or material that flows laterally, which prevents large amounts of material to collect at single points. In order to provide for other means to "swallow" molten material it is possible to make grooves or depressions adjacent and close to the sealing strips. In the case of grooves such grooves would run parallel to and very close to said strips, preferably on both sides of the strips, i.e. also between strips in the case of concentric strips.

Figure 3:
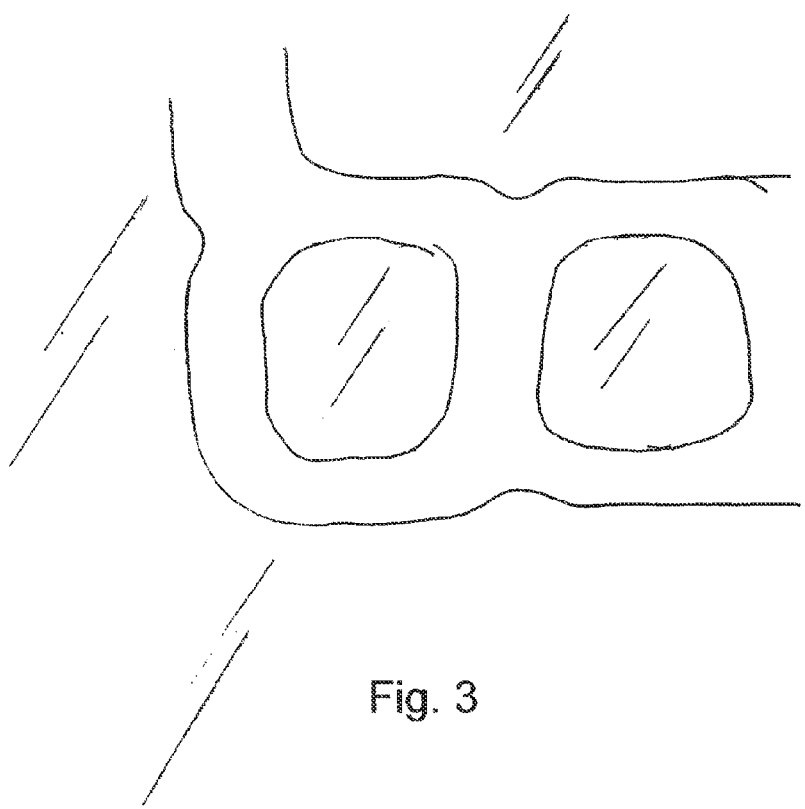
FIG. 3 illustrates a lay-out for controlling compressibility.

Furthermore, in order to reduce the tendency of flowing molten material to collect at corners, preferably corners and "T"-branches where cross-bars connect to the concentric lines, are made to exhibit a geometry as shown in FIG. 3. Thus, as can be seen in FIG. 3 there will be provided curved or rounded sections exhibiting a suitable radius of curvature such that the width of the individual concentric lines of the sealing structure is essentially the same at every point along the entire structure. In this way the sealing structure will exhibit the same compressibility at all points.

Furthermore, the compressibility of the structure is dependent on the number of cross-bars per unit area of said structure and varying the density of cross-bars (i.e. the number of cross-bars per unit area or length) enables control of compressibility.

The above described principle of providing redundancy in the sealing to reduce risk of leakage is generally applicable for many different applications and bonding methods. Further modifications to the structure will then become necessary, and such modifications will be described in connection with each method to be described below.

The sealing principle is usable in the manufacture of a number of monolithically integrated components such as MEMS and/or CMOS devices. Two different types of devices will be described below with reference to FIGS. 7-9.

It is to be noted that the bonding methods described below in connection with manufacture of the described devices are all wafer level methods, i.e. the bonding is performed between wafers and the individual components are obtained from the combined wafers after bonding by sawing. Thus, each wafer comprises a large number of structures such as monolithically integrated structures, e.g. MEMS structures, and wherever the term "a CMOS structure" or "a MEMS structure" or "a depression or cavity" is used it should be taken to encompass also a plurality of such structures provided on a wafer.

The first device according to one embodiment of the present invention to be described, shown in FIG. 7, is a CMOS device 70 comprising a first substrate 71 (such as a wafer) on or in which a CMOS structure 72 is made. This CMOS structure is encapsulated by providing a "capping structure", i.e. a cover or lid 73 (below referred to as a CAP, also in the form of a wafer) in which a depression could be formed, said depression forming a cavity 74 housing the area of the first substrate carrying the CMOS structure.

In order to connect the CMOS structure inside the cavity with other components there is provided routing structures 75. Such routing comprises strips of metal, suitably gold although other metals are possible such as Al, Ag, Cu or other metals exhibiting low resistivity (high conductivity). The routing strips terminate in bond pads 76 onto which wires can be attached for further connection to other electronic components. These routing strips will inevitably have a finite thickness, in the order of 0,5-3 μm. This will create the topography mentioned above.

In this case, i.e. where wire bonding is contemplated, the CAP structure in the finished chip should be slightly smaller than the bottom wafer so as to leave a shelf on which the wire bonding can be made.

The above structure is achieved with a novel method of singulating dicing of the wafers and will be described with reference to FIG. 4.

FIG. 4a shows schematically the required wafer structure in cross-section. Thus there is provided a CMOS wafer 40 having some CMOS structure 41. A capping wafer 43 is bonded to the CMOS wafer using some suitable method. In the capping wafer there are provided sawing grooves 44 extending around the portions that will form the final individual chips.

In FIG. 4b a capping wafer 43 is shown schematically and containing only four sawing grooves 44 to be cut (in reality of course several thousand chips can be singulated using this principle). Also hear sawing lines are shown in broken lines and designated S.

When the composite wafer comprising a substrate 40 and a cap 43 is subject to sawing through the cap along the lines indicated by an S and broken lines, the saw blade will cut through the cap 43 in the grooves 44, but in all other portions it will only create a groove, i.e. at the portions designated P (only two of which are explicitly indicated in the figure). Thus, as can be understood from inspecting FIG. 4b after having sawn through each groove 44 the remainder of the cap will form a unit that simply can be lifted off the composite wafer leaving the substrate with its functional cap on each CMOS structure. The substrate can then be diced by sawing at D.

As sawing continues, in order to prevent the capping wafer 44 portion being cut loose to "wobble" due to the forces imparted by sawing, the capping wafer is fixated to the support wafer 40 at a few points FP, indicated as dotted circles in FIG. 4b. 2-6 points for an entire wafer is sufficient, although more can be provided if needed. These fixating points are suitably provided in the bonding process as posts connecting the wafers to each other. When sawing is finished these posts are simply cut away.

For joining the CMOS substrate with the CAP any of the previously mentioned methods can be used. However, each method will require certain specific measures to be taken.

In a first embodiment a thermo compression (TC) method is used.

Thereby each wafer is provided with a sealing structure S as described above (only schematically shown in FIG. 7). Thus, in the simplest form the sealing will be provided as two concentric lines encircling the structure to be sealed. The lines are suitably of gold, although other metals are possible such as silver or copper. Typically the lines are 5 μm thick and a few μm wide.

These lines are made by a combined sputtering/evaporation/plating and etching method well known to the skilled man and will not be described in detail herein. Before plating, the routing structures must be isolated by depositing an oxide layer or other insulating material over the routing structures at least over the parts where the gold sealing will be provided. This insulating oxide layer is clearly seen in FIG. 5, and indicated by arrows.

Figure 5:
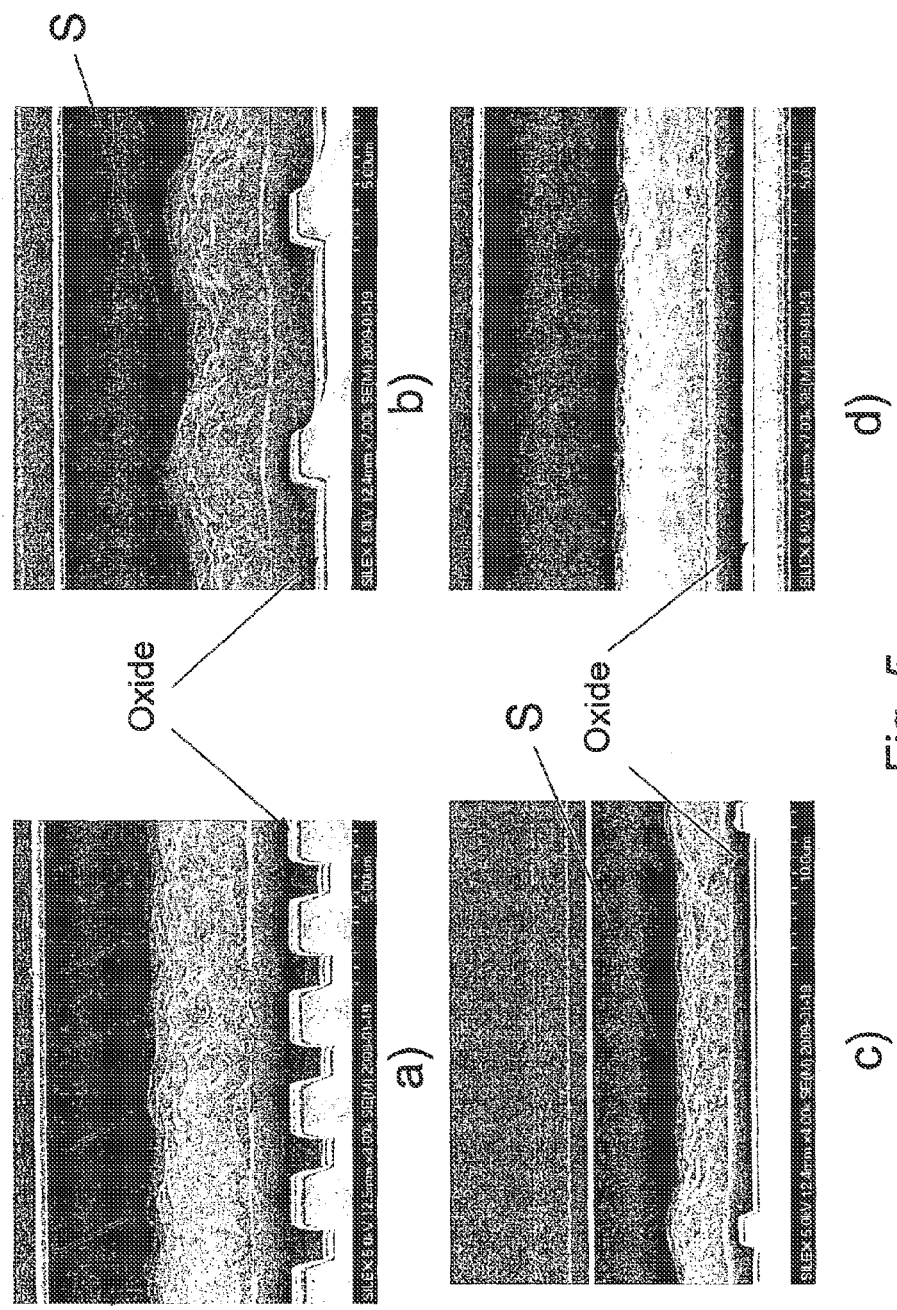
FIG. 5 illustrates the effect of topography on bonds.

However, as also shown in FIG. 5 the topography of the routing structures will be carried over to the gold in the sealing structure. The gold provided over the routing exhibits small "hills". This is clearly visible in FIGS. 5b) and 5c) and emphasized in FIG. 5a) by the arrows. FIG. 5d) shows a structure without routings, and thus no topography, which in turn results in the sealing being also without topography.

As can also be seen in FIG. 5 there is a dark shadow S in the interface between the upper and lower parts of the bond in the region between the "hills". This dark portion may indicate incomplete contact between the gold sealing lines and is a potential leakage point. It is also clear that there is much better contact at the hill tops.

According to the invention, one solution to this problem is to make the sealing lines slightly wider (by using photolithographic methods for providing the sealing lines) in the region where they extend between the routing lines than where they cross the routing lines. In this way the compressibility of the sealing lines will vary. It will be higher between routings and lower at the routings. Thus, it will be easier to compress the sealing material at the point where the sealing ring crosses the routing strips, thereby causing the "hills" to be levelled out in the bonding process.

Figure 6:
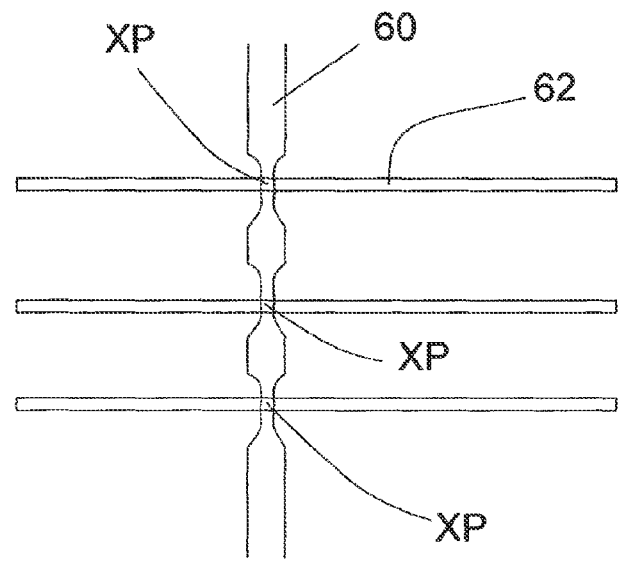
FIG. 6 shows one way of controlling compressibility.

FIG. 6 illustrates this schematically. The sealing strip 60 has a width of about 3-5 μm between the routings 62 and about 2-3 μm at the crossing points (or intersections) XP. The thickness is about 5 μm. However, of course the dimensions will be depending on the actual topography present. The thickness must be a few μm higher than the topography, i.e. using 5 μm thick sealing strips one could seal routing lines with a thickness of up to 3 μm.

In another embodiment a eutectic bonding method is used. Thereby, the material selection for the sealing lines will be different. Namely, one of the wafers is provided with bonding structures of a material comprising one component of a eutectic composition and the other wafer is provided with complementary bonding structures of the other component of said eutectic composition.

The material on one wafer in one embodiment is preferably gold (Au) and on the other e.g. gold-tin (AuSn). These two materials in proper proportions will form a eutectic having a melting point substantially lower than each component separately, namely 282° C.

In another embodiment the first component can be silicon and the other component can be gold (Au). These materials form a eutectic at 363° C., which is a temperature significantly lower than the CMOS processing temperatures. Thus, it is possible to bond wafers with CMOS structures on them without risk of damaging the CMOS components. Other eutectic material combinations are possible such as Au/poly-SiGe or Au/poly-Si.

For both alternatives (i.e. Au/Sn and Au/poly-Si) it is important to dimension the lines of material such that the proportion between the material amounts corresponds to the eutectic composition. This means that for Au/Sn the material in the finished sealing line should correspond to about 80 atom-% of the gold of the total amount of material, to obtain the best eutectic composition. Selection of correct proportions is within the competence of the skilled man knowing how to interpret phase diagrams.

However, in some cases it will be preferred to provide one component in excess, depending on the desired result.

In accordance with a still further aspect the invention provides an improvement in the methods of joining substrates by bonding which involves providing one of the components in the form of what will be referred to as a "knife structure". The knife component must be of a material being less compressible than the other component. One example of such a pair of components is Au/poly-Si where Au is the soft component and poly-Si is the hard. Other alternatives are stand-off knives defined by electroplated Ni or deposited or grown silicon oxide and silicon nitride.

Figure 9:
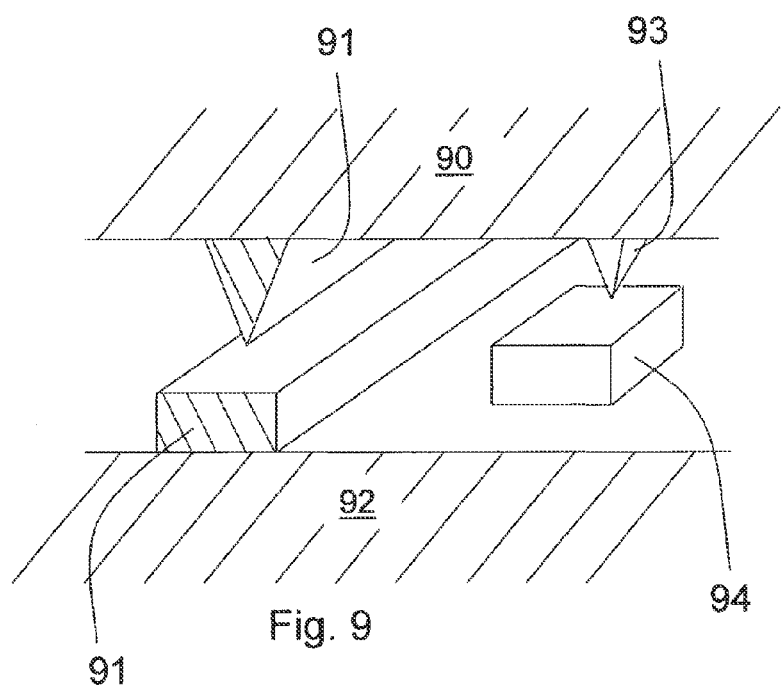
FIG. 9 illustrates the "knife" embodiment of the invention.

The inventive idea is to increase the force exerted on the soft component in TC bonding by making the knife component narrow and sharp. If the bond is for contact points only and not for sealing structures the "knife" will be provided as a "needle" rather than a "knife". This is schematically illustrated in FIG. 9 which in cross-section shows a first substrate 90 provided with a knife 91 on one surface, and a mating soft component in the form of a ridge 92 on the surface of a second substrate 92 having essentially rectangular cross-section. Thus, a "knife" is a wedge-like elongated structure. Also shown is a needle 93 provided on the first substrate 90 over a soft pad 94 provided on the second substrate. When the two substrates are pressed against each other the knife 91 and needle 93 will easily cut into their mating soft components, i.e ridge 91 and pad 94, respectively, and form a good contact there between.

Figure 10:
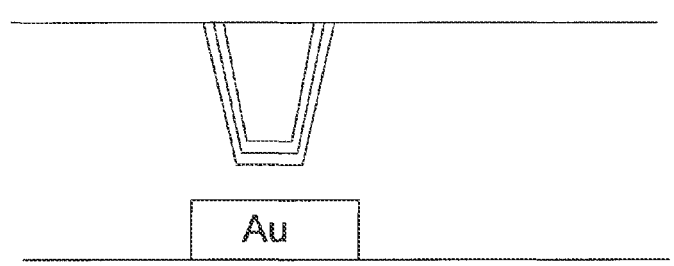
FIG. 10 shows a knife in detail.

For certain applications where there is no need for electrical contact between substrates through the sealing or by using contact pads, the knife or needle will be made of poly-Si only, possibly with an oxide coating to render the knife/needle insulating against the gold. This is schematically illustrated in FIG. 10.

For other applications it can be desirable to provide an electrical contact between substrates using the sealing or contact pad structure. In such case the poly-Si knife or needle coated with the same metal as in the mating pad/sealing ring, e.g. gold if the mating pad is of gold. Optionally it can be first coated with an oxide layer.

The knife and/or needle concept is usable for both TC bonding and eutectic bonding.

The above described bonding methods can also be used for other types of device. As an example, a device will be described wherein there is provided a CMOS (or MEMS) component on one wafer, and a cavity in the CAP, and wherein there is no lateral routing to external contact pads for wire bonding, but instead the signals are passed through the wafers in so called vias (wafer-through-connections).

Such vias are disclosed in many patents and applications, i.a. applicants own patent SE-526 366, International patent application WO2004084300A1 and Swedish patent application 0850083-7 and will not be discussed per se herein.

The advantage of providing vias for signal transmission is that it is possible to route signals to the bottom (or top) side of the component, which allows for e.g. flip-chip bonding, and the fairly cumbersome wire bonding can be refrained from. Having said that it should be borne in mind that for some applications wire bonding is necessary.

Lateral (through via) routing (see FIG. 8) is less area consuming than horizontal routing (see FIG. 7), and could therefore reduce the cost per chip.

Thus, in FIG. 8 there is shown a component 80 comprising a bottom wafer 81 in which there is a CMOS or a MEMS structure 82 provided in the surface of the wafer. On top there is a second wafer (CAP) 84 optionally having a depression 85 to provide a controlled atmosphere for the CMOS. In the top wafer 84 there are vias 86 enabling signals to be transferred to the back (top) of the component 80. The bonding methods described in detail above makes it possible to integrate getter material (G) as further described in applicants own WO2008/091221.

In this embodiment of the invention there is first provided a passivation layer (not shown) on the CMOS structure with openings only at the points 87 where it is desired to make contact. Then there are provided routing strips of e.g. gold to points between the CMOS and the sealing ring SR, at which point there are provided contact pads 88. These pads are made so as to be processable at the same time as the wafer bonding is performed.

Correspondingly, the CAP wafer is passivated leaving openings only where the vias are located to provide contact points, and routings are provided from these contact points. These routings also end in contact pads 89. The constitution and material of the pads are similar to the sealing rings SR and are aligned with the pads on the CMOS wafer in order to mate with them.

For TC bonding the pads and sealing rings are made of gold.

Thus, when the wafers are brought together under application of force and elevated temperature, both the sealings SR and the connections at the bond pads 88, 89 will form adequate bonds.

Figure 11:
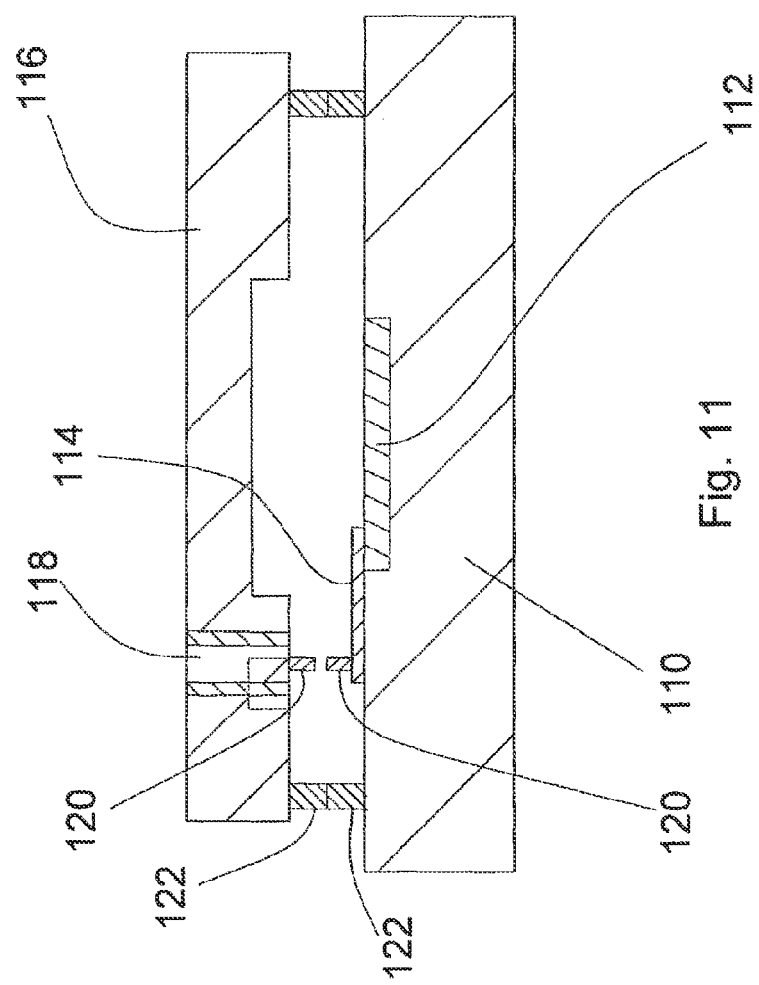
FIG. 11 shows a combination of bonding methods.

Referring now to FIG. 11 a combination of bonding methods will be described. As mentioned in relation to FIG. 5 there is a problem in TC bonding of potential leakage. Thus, for sealing purposes eutectic bonding can preferred. Where topography is present TC bonding can still be used. FIG. 11 shows a CMOS wafer 110 with CMOS structure 112 and routing 114 to be connect through a capping wafer 116 through a via 118.

Connection is by a TC bond 120 using gold (Au), and sealing is achieved via a eutectic bond 122 using AuSn eutectic.

Suitably, the "posts" 120 forming the TC bond are made slightly lower on the capping wafer 116 than the sealing "posts" 122 on the same wafer. Thereby one ascertains that a TC bond forms properly since the eutectic bond will absorb the difference in height and nevertheless form a tight seal.

In a particularly advantageous embodiment, the poly-silicon used for one of the components in a sealing structures is anchored in the substrate wafer. This is schematically illustrated in FIG. 12a. This illustrates a situation where there is much more Au available than is required for a eutectic composition to form.

Thus, on a first substrate wafer 100 there is provided a first soft component 101 of a sealing structure, suitably made of Au, or AuSn or other eutectic compositions. On a second substrate 102 there is provided a second, component 103, suitably made of poly-silicon, Au, AuSn or Au coated poly-silicon.

The second substrate 102 is covered with a thin oxide layer 105. According to the invention a recess 104 is made in the thin oxide layer 105. The second component 103 is then provided so as to extend into the recess 104.

The advantage of anchoring the p-Si in this way is that the Si in the wafer becomes available in the bonding process, i.e. the formation of the eutectic composition, and represents an "infinite" amount of silicon. Thereby the strength of the joint is increased.

A further feature that is advantageous, shown in FIG. 12b, is that the second component 103' is provided with a very thin (in the 100 nm range) layer 108 of Au in order to prevent oxidation. Oxidation of the silicon in the second component 103' could render the eutectic formation more difficult.

A problem that can occur in eutectic bonding is that the eutectic composition when formed forms a liquid (melt), and thus can flow out laterally on the substrate surface, which would cause damage to the device, with lower manufacturing yield as a result. Such lateral flow should therefore be avoided, preferably eliminated.

Therefore, in a still further aspect of the invention, there are provided structures that are adapted to prevent such lateral outflow of molten material. Such structures can be of various design and different embodiments are described below with reference to FIGS. 13 and 14

Thus, in FIG. 13a there is shown a spacer member 106. This is provided as a "bond stop", and defines a minimum allowable distance between the wafers. Thus, it will prevent the bond between the first and second components 101, 103 to become too "deep", such that the wafers come to close to each other. Thereby, the molten material will be confined to the area of the bond. This spacer 106 will not undergo a melting itself. It is suitably made of silicon oxide or Au or poly-silicon or any hard material such as oxides in general. Thus, it will not participate in the formation of a eutectic composition.

The important property of the member 106 is that it does not melt in the bonding process, and preferably it should be hard. This spacer 106 can be provided on any of the two wafers 100, 102. In the FIG. 13a it has been shown on both wafers for illustration purpose, and it would of course be possible to provide it on both, although this is not regarded as practical.

The "bond stop" member 106 will effectively prevent the two components 101 and 103, respectively, from being compressed beyond a certain limit. The height or thickness of the member 106 is selected such that thereby no outflow of material will take place.

Preferably the spacer is provided on wafer 102 and is made of oxide.

In FIG. 13b another embodiment is shown schematically. This is applicable for eutectic bonding structures, i.e. such as for Au/p-Si or Au/Sn bonding systems.

Thus, this embodiment comprises, like in the embodiment of FIG. 13a, a first component 101' on a first substrate 100', and a second component 103' on a second substrate 102', the two components being capable of forming a eutectic composition. However, such anchoring could of course be made also in this case.

By providing a "collar" 107 made of seed material (i.e. Au) which has much better wetting capability than the substrate, the molten eutectic will be confined to the area of the collar when formed, and begins to flow laterally.

In the Figure the collar 107 is shown adjacent the first component 101'. However, it would be equally possible to provide the collar adjacent the second component 103', or in fact adjacent both components.

The molten material can thus flow along the collar and advantageously, locally it can seal unwanted pores or other points of potential leakage that might have occurred during manufacture of the sealing structure.

Figure 14:
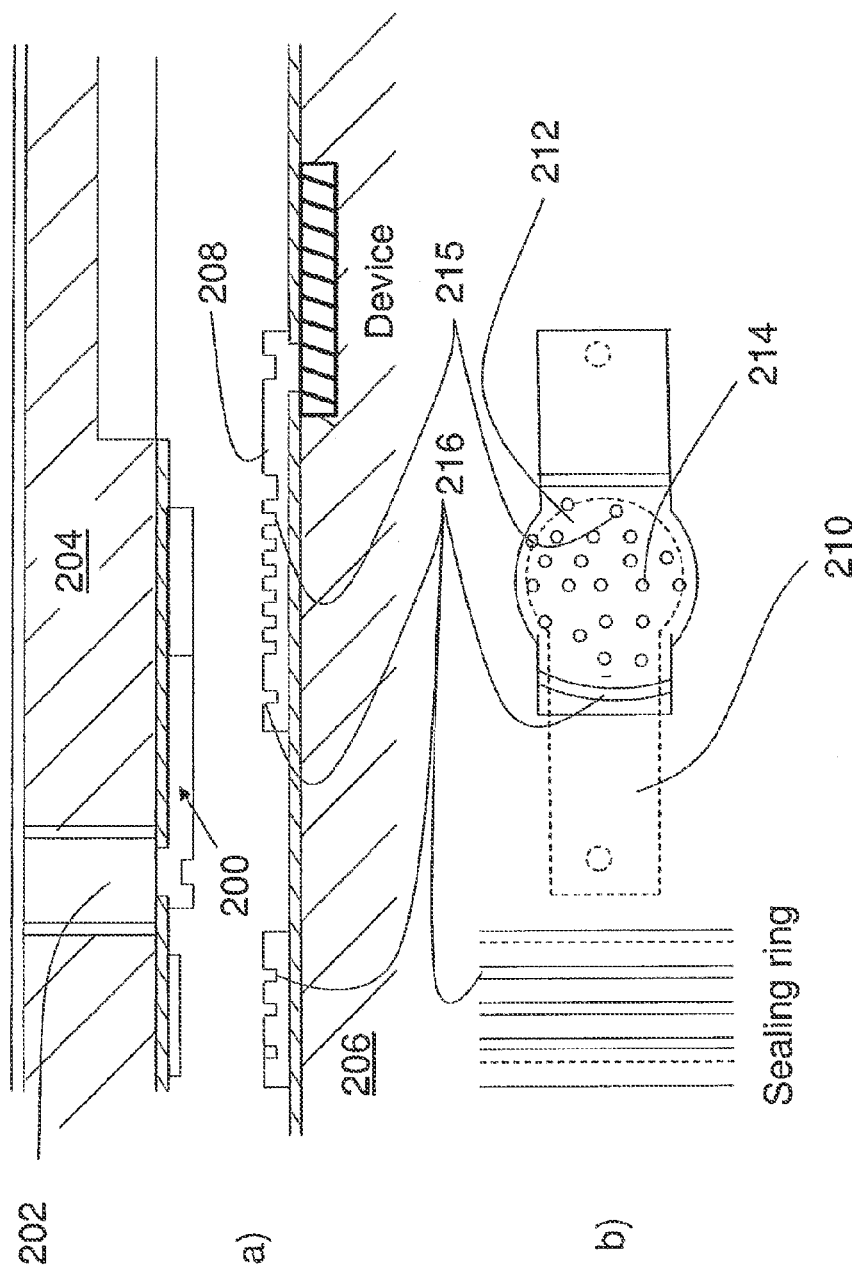
FIG. 14 shows aspects of the invention implemented in a routing structure.

In still another advantageous embodiment, schematically shown in FIG. 14, the poly-silicon is used for routing purposes. Here, there is provided a structure 200 that will pass a signal from a via 202 in a first substrate 204 laterally on the surface of the substrate to some location at a distance from the via. At the laterally distant point a bond is to be made for transferring the signal to some component or to another via in a second substrate 206. To this end there is provided a pad 208 of Au, in order that a eutectic bond be made.

The poly-Si structure 200 is provided as a thin layer (typically in the μm thickness range, about 4 μm is usable), suitably made by depositing by LPCVD or RF sputtering or epitaxial growth. The thickness of the Au pad 208 is typically in the μm range, preferably <0,5 μm.

In FIG. 14b the overall routing structure (i.e. the combination of Au member 200 and poly-Si pad 208) is shown in a top view. The Au member 200 is shown in ghost lines comprises a strip portion 210 that is relatively narrow, and a contact portion 212, in the shown embodiment essentially circular in shape. In this figure the novel feature according to the invention is seen. Namely, as already discussed previously, during formation of a eutectic bond, the metals melt and the eutectic composition easily flows out laterally, which would cause damage to the device, with lower manufacturing yield as a result. It is therefore desirable to prevent such outflow. By making dimples, i.e. small detents or depressions 214 in the poly-silicon portion of the routing structure that is to be brought into contact with the Au pad, any excess melt that would tend to flow over and come out onto the substrate will be "swallowed" by the dimples.

The dimples can be shallow, i.e. only extending down a portion of the thickness of the material forming the contact portion 212, or they can extend all the way down to the substrate below. The latter would be simpler to manufacture in that the dimples can be made in the same process step as the routing structure itself.

The dimples could equally well be provided in the Au structure 200 on the other wafer. However, it is preferred to make the dimples in the poly-silicon since Au requires wet etch processes, and the size and shape of the dimples is less controllable with such methods.

Preferably the dimple pattern is laid out such that even if there is a slight misalignment between the two components in the bond, there will be essentially the same area of contact between the materials in the components. To achieve this one has to consider the area of the component without dimples and the density of dimples (number per unit area) and match these to each other.

Although a pattern of dimples is preferred at present, other ways for achieving the desired objective are possible.

Instead of dimples, recesses or grooves extending in or along the sealing structures can be provided. One example is shown in FIG. 14 where there is a shallow (i.e. not extending all the way through) recess 216 provided in poly-silicon member 208 adjacent the contact portion 212 of the routing structure. This recess 216 will safeguard against any lateral flow that might have escaped the dimple structure 214 on the contact portion 212.

The dimples or recesses are suitably made by conventional lithography and etching processes.

Of course the principle of using dimples can be used generally for any bonding system where there is a tendency that molten material tends to spill over and contaminate undesired areas of a product being manufactured.

In particular the structures for preventing lateral flow of molten bonding material can be used in the sealing structures discussed previously herein, and such application of the methods and means is also within the inventive concept as presented herein.

In particular such flow preventing structures can be provided as recesses or grooves 216 extending along the sides of the sealing rings or between "concentric" sealing rings.

Although the invention has been described with reference to a eutectic composition comprising Au and poly-silicon, it is of course applicable to any other eutectic composition, such as but not limited to AuSn/Au, pSiGe/Al, pSiGe/Au, Pb based solders.

The invention claimed is:

1. A sealing and bonding material structure for joining semiconductor wafers having monolithically integrated components, the sealing and bonding material being provided in strips forming closed loops, comprising:
   at least two concentric sealing strips (10, 12) on one wafer (16), a first (10) of said concentric sealing strips surrounding a second (12) of said concentric sealing strips such that said second of said concentric sealing strips is inside a perimeter of said first of said concentric sealing strips,
   said concentric sealing strips (10, 12) being laid out so as to surround the component(s) (18) on the wafers to be sealed off when wafers are bonded together,
   the material(s) in said concentric sealing strips (10, 12) being capable of bonding said semiconductor wafers together and provide a seal for the monolithically integrated components, when subjected to force,
   a compressibility of the concentric sealing strips vary along an extension of the sealing structure on the substrate to accommodate topography on the substrates when bonded together, and
   the material(s) in the concentric sealing strips configured to permit thermo-compression bonding or eutectic bonding.

2. The sealing and bonding material structure as claimed in claim 1, wherein cross-bars of sealing material connect said concentric sealing strips at selected intervals along said concentric sealing strips.

3. The sealing and bonding material structure as claimed in claim 1, wherein a compressibility of the cross-bars vary along the extension of the sealing structure on the substrate to accommodate topography on the substrates when bonded together.

4. The sealing and bonding material structure as claimed in claim 1, wherein the compressibility of the concentric sealing strips corresponds to a width and/or thickness of the concentric sealing strips.

5. The sealing and bonding material structure as claimed in claim 4, wherein the concentric sealing strips in said structure are slightly wider in a region where the concentric sealing strips extend between areas exhibiting no topography, than where the concentric sealing strips cross areas exhibiting topography.

6. The sealing and bonding material structure as claimed in claim 3, wherein a compressibility of the cross-bars corresponds to a width and/or thickness of the cross-bars.

7. The sealing and bonding material structure as claimed in claim 3, wherein a compressibility of the cross-bars corresponds to a quantity of the cross-bars per unit area of said structure.

8. The sealing and bonding material structure as claimed in claim 3, wherein a compressibility of the structure corresponds to a layout of the intersections between the cross-bars and the concentric sealing strips.

9. The sealing and bonding material structure as claimed in claim 3, wherein corners and "T"-branches where the cross-bars connect to the concentric sealing strips exhibit a geometry such that there is provided curved or rounded sections exhibiting a radius of curvature, whereby a width of individual concentric sealing strips is essentially the same at every point along the entire structure.

10. The sealing and bonding material structure as claimed in claim 1, wherein the material(s) is/are one of the group consisting of: gold (Au), gold-tin (AuSn), a combination of gold and silicon, poly-silicon, silicon and germanium Au/poly-SiGe, and Au/poly-Si.

11. The sealing and bonding material structure as claimed in claim 1, wherein the material of said concentric sealing strips comprise two material components, a first component being silicon and a second component being gold (Au).

12. The sealing and bonding material structure as claimed in claim 1, wherein the material(s) in said concentric sealing strips (10, 12) is/are capable of bonding said semiconductor wafers together and provide a seal for the monolithically integrated components, when subjected to force and also optionally heating.

13. The sealing and bonding material structure as claimed in claim 4, wherein the concentric sealing strips in said structure are slightly wider in a region where the concentric sealing strips extend between routing lines than where the concentric sealing strips cross the routing lines.

* * * * *